United States Patent [19]
Kim et al.

[11] Patent Number: 5,461,591
[45] Date of Patent: Oct. 24, 1995

[54] VOLTAGE GENERATOR FOR SEMICONDUCTOR MEMORY DEVICE

[75] Inventors: Tae-hoon Kim; Young-Hyun Jun, both of Seoul, Rep. of Korea

[73] Assignee: Goldstar Electron Co., Ltd., Cheongju, Rep. of Korea

[21] Appl. No.: 161,761

[22] Filed: Dec. 2, 1993

[51] Int. Cl.$^6$ ................................ G11C 7/00; H03K 3/01
[52] U.S. Cl. .................. 365/226; 365/189.09; 327/534; 327/548
[58] Field of Search ..................... 365/226, 227, 365/189.09, 226, 227; 307/296.1, 296.2, 475; 327/530, 534, 535, 548

[56] References Cited

U.S. PATENT DOCUMENTS

| | | | |
|---|---|---|---|
| 4,705,966 | 11/1987 | Van Zanten | 307/296.2 |
| 4,775,959 | 10/1988 | Sato et al. | 365/189 |
| 4,810,952 | 3/1989 | Cohen | 323/300 |
| 4,843,256 | 6/1989 | Scade et al. | 307/296.2 |
| 4,961,007 | 10/1990 | Kumanoya et al. | 307/296.2 |
| 4,985,869 | 1/1991 | Miyamoto | 365/226 |
| 5,072,134 | 12/1991 | Min | 307/296.2 |
| 5,124,574 | 6/1992 | Ibaraki | 365/226 X |
| 5,146,110 | 9/1992 | Kim et al. | 307/296.2 |
| 5,243,228 | 9/1993 | Maruyama et al. | 307/296.2 |

FOREIGN PATENT DOCUMENTS

| | | | |
|---|---|---|---|
| 0193056 | 11/1984 | Japan | 307/296.2 |

*Primary Examiner*—Joseph A. Popek
*Assistant Examiner*—Son Dinh
*Attorney, Agent, or Firm*—Alan R. Loudermilk

[57] ABSTRACT

A voltage generator for use in a semiconductor memory device suitable for use as a backbias voltage generator, as an internal high voltage generator, or as an internal power voltage generator. The present invention includes: a rectifier for producing a dc voltage power by rectifying clock signals; an oscillator including an odd number of invertors connected in series, and with the output of the last invertor fed back to the first invertor so as to oscillate clock pulses; and one or more bypass circuit connected so as for the output of the first invertor to bypass one or more intermediate invertors, and connected and disconnected by a control switch.

44 Claims, 4 Drawing Sheets

VOLTAGE GENERATOR FOR SEMICONDUCTOR MEMORY DEVICE

FIELD OF THE INVENTION

The present invention relates to a voltage generator for a semiconductor memory device, in which the oscillating period is controlled during the charge pumping to adjust the power generation amount per unit of time, so that the voltage generator can be used as a backbias voltage generator, as an internal high voltage generator, or as an internal power voltage generator.

BACKGROUND OF THE INVENTION

A backbias voltage generator which is a kind of the voltage generator used in a conventional semiconductor memory device is disclosed in U.S. Pat. No. 4,775,959.

As shown in FIG. 2, this backbias voltage (also called Vbb) generator includes a first Vbb generator Vbb-G1 and a second Vbb generator Vbb-G2.

The first Vbb generator Vbb-G1 includes a first oscillating section OSC1 and a rectifying section REC, while the second Vbb generator Vbb-G2 includes a second oscillating section OSC2 and a rectifying section REC.

The first and second Vbb generators Vbb-G1 and Vbb-G2 are composed of voltage generating circuits, one of which is shown in FIG. 1.

As shown in this drawing, the first inputs of the three NAND gates are connected in series, and the output of the last NAND gate is connected to the input of the first NAND gate, so that the oscillation circulating signals are circulated, thereby forming an oscillator. The output of this oscillator is supplied through a buffer circuit 12 to a first electrode of a pumping capacitor C1. A second electrode of this capacitor is connected to a rectifier which consists of transistors 16 and 17 (each of which serve as a rectifying element). Further, the second inputs of the three NAND gates NAND1, NAND2 and NAND3 are commonly connected together to receive oscillator enable signalEN.

The capacitor of the second Vbb generator Vbb-G2 has a large capacitance, while the capacitor of the first Vbb generator Vbb-G1 has a relatively small capacitance. The voltage generating operation of this circuit is carried out in such a manner that, if the internal power source Vcc is supplied, the oscillator enable signals are supplied to the second inputs of the NAND gates to activate the oscillator OSC so that oscillations start, and that an oscillating output is generated.

If the oscillation output signals have a high level, the signals make first electrode 14 of the pumping capacitor have a high level after passing through a buffer circuit 12 which drives the pumping capacitor. A second electrode 15 of the pumping capacitor is also made high by the coupling effect, thereby raising the voltage.

If the potential of the second electrode 15 of the pumping capacitor is higher than a positive terminal (e.g., ground potential), then a first rectifying device 16 is made conductive, so that its drain voltage becomes the same as that of the positive terminal.

Then, if the oscillation output signals are shifted to a low level, the signals make the first electrode 14 of the pumping capacitor have a low level after passing through the buffer circuit 12 which drives the pumping capacitor. At the same time, the second electrode 15 of the pumping capacitor becomes low by the coupling effect.

The potential of the second electrode 15 of the pumping capacitor become lower than that of the positive terminal, with the result that the first rectifying device 16 is made nonconductive. If the potential of the second electrode 15 of the pumping capacitor becomes lower than the potential of a negative terminal (e.g., backbias potential), then the second rectifying device 17 is made conductive, so that its potential becomes the same as that of the negative terminal.

Then, the oscillation output signals are shifted to a high level again to repeat the above operations, with the result that the electrons of the positive terminal are pumped by being transferred to the negative terminal, thereby generating a voltage.

The amount of negative voltage generating power by the first Vbb generator Vbb-G1 is very weak, but it is designed that the generated voltage is sufficient to compensate the leakage of the transistors during a standby mode in which the chip is not operated.

Meanwhile, the amount of the negative voltage generating power by the second Vbb generator Vbb-G2 is much larger, so that it is able to compensate the leakage of the transistors during the operation of the semiconductor device. If the voltage generation is made to be large, the capacity of the buffer circuit which drives the pumping capacitor has to be made large, as well as increasing the capacities of the pumping capacitor and the rectifying device.

In the circuit of FIG. 2, if the negative voltage is continuously supplied until the voltage level of the Vbb drops to below a certain predetermined value, then a backbias voltage detecting section (VLD section) emits a backbias voltage detecting signal, so that the voltage generator enable signal shifts from high to low, thereby maintaining the voltage at a constant level.

In this conventional technique, when the chip is in the standby state, most transistors are turned off, and only equalizers and some transistors operate, so that the leakage rate is relatively small. Under this condition, only the first Vbb generator Vbb-G1 which has a small driving capacity is driven, so that the power consumption can be reduced. Meanwhile, when the chip is active, or when the Vbb voltage level is below the predetermined level (−3 Vth), the second Vbb generator Vbb-G2 which has a large driving capacity is driven, so that the increase of the Vbb voltage due to the large current leakage through the driving of a large number of transistors can be prevented.

The above described voltage generator for use in a conventional semiconductor memory device has a fixed oscillation period, and, therefore, it cannot accurately operate against the current leakage in a plurality of transistors in which the operation conditions are varied in the case of the active and standby conditions. That is, the oscillating frequency is decided by calculating the average of the current leakage. Further, the peak current for driving the large pumping capacitor becomes very high, thereby causing large voltage variations, as well as aggravating the reliability of the semiconductor memory device.

SUMMARY OF THE INVENTION

The present invention is intended to overcome the above described disadvantages of the conventional technique.

Therefore, it is an object of the present invention to provide a voltage generator for use in a semiconductor memory device in which the oscillating period is controlled during the pumping operation to adjust the power generation pumped per unit of time, in such a manner that the voltage generator is suitable for use as a backbias voltage generator, as an internal high voltage generator, or as an internal power voltage generator, whereby the voltage is maintained at a constant level. Therefore, the charge pumping capacity is not adjusted by means of the pumping capacitor, but by the oscillation rate to adjust the pumping capacity to compensate for variations of the load. Accordingly, a large capacitor is not required, and the size of the transistor driving the pumping capacitor does not have to be large. Consequently, the peak current can be reduced, and the oscillating frequency (pulse rate) can be adjusted for the relevant purpose. Therefore, the charge pumping rate per unit of time can be increased or decreased in an easy manner.

In achieving the above object, the voltage generator for use in a semiconductor device according to the present invention includes: a rectifier for producing a dc voltage power by rectifying clock signals; an oscillator including an odd number of invertors connected in series, and with the output of the last invertor fed back to the first invertor so as to oscillate clock pulses; and one or more bypass circuit connected so as for the output of the first invertor to bypass one or more intermediate invertors, and connected and disconnected by a control switch.

There are provided: a backbias voltage generator, with the output of the positive side of the rectifier being connected to a ground potential, and the negative side being connected to the backbias potential; an internal high voltage generator, with the output of the positive side of the rectifier being connected to the internal high voltage terminal, and the negative side being connected to the ground potential; and an internal power voltage generator, with the output of the positive side of the rectifier being connected to the internal power voltage terminal, and the negative side being connected to the ground potential.

The control switch of the backbias voltage generator is turned on and off by backbias voltage level detecting signals, address strobe signals and sense amplifier enable signals.

A plurality of bypass circuits can be installed so as for the bypass circuits to accurately respond to different load conditions, but here, in a simplified manner, the bypass circuit includes: a first bypass circuit having a control switch to be turned on or off by the backbias voltage level detecting signals; a second bypass circuit having a control switch to be turned on or off by the address strobe signals; and a third bypass circuit having a control switch to be turned on or off by the sense amplifier enable signals.

An odd number of invertors are composed of three 2-input NAND gates, and an even number of invertors. The control switch preferably consists of a transmission gate in which an NMOSFET and a PMOSFET are connected in parallel. Inversely operating control switches which are turned off upon turning on the control switch and turned on upon turning off the control switch (which turns on or off the bypass circuit) are installed at the front and rear of the bypassed invertors to be connected to the invertors in series.

The first input terminals of the three 2-input NAND gate are connected to the oscillating circuit in series to receive the circulating signals, while their second input terminals receive a power stabilizing signal which is generated when the internal power voltage of the semiconductor memory device rises to a certain predetermined level.

The control switch of the internal high voltage generator is turned on or off by the internal high voltage level detecting signals or by the word line enable signals.

The bypass circuit forms: a first bypass circuit having a control switch which is turned on or off by the internal high voltage level detecting signals; and a second bypass circuit having a control switch which is turned on or off by the word line enable signals.

The internal power voltage generator includes a bypass circuits having control switches which are turned on or off by the internal power voltage level detecting signals or by the sense amplifier enable signals.

The rectifier includes: a pumping capacitor; a buffer circuit connected to a first electrode of the pumping capacitor for driving the pumping capacitor; a first rectifying device connected to a second electrode of the pumping capacitor for connecting the second electrode to the positive terminal when the potential of the second electrode is higher than that of the positive terminal; and a second rectifying device connected to the second electrode of the pumping capacitor for connecting the second electrode to the negative terminal when the potential of the second electrode is lower than that of the negative terminal.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENTS

Figure 4:
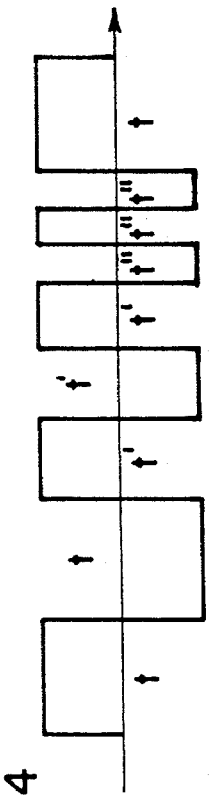
FIG. 4 illustrates wave forms of the output of the oscillator according to the present invention.
Figure 3:
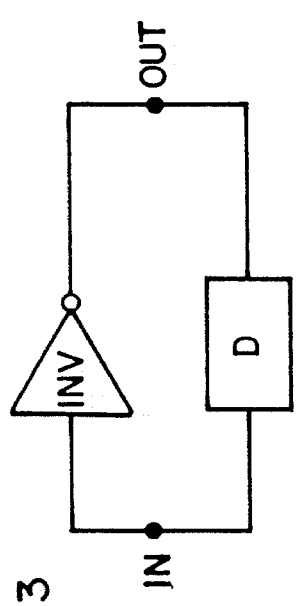
FIG. 3 is a block diagram showing the constitution of the oscillator used in the present invention.

The principle of the oscillator according to the present invention is that the output of inverting device which inverts the voltage of the input signals as shown in the block diagram of FIG. 3 is fed back through a delaying means D to the input side, whereby oscillations are produced by circulating the signals. As shown in FIG. 4, the output wave form is such that the clock frequency becomes smaller, the longer the signal delay time is. On the other hand, if the signal delay time is shorter, the clock frequency becomes higher. In FIG. 4, a relation t>t'>t" becomes valid.

Figure 5:
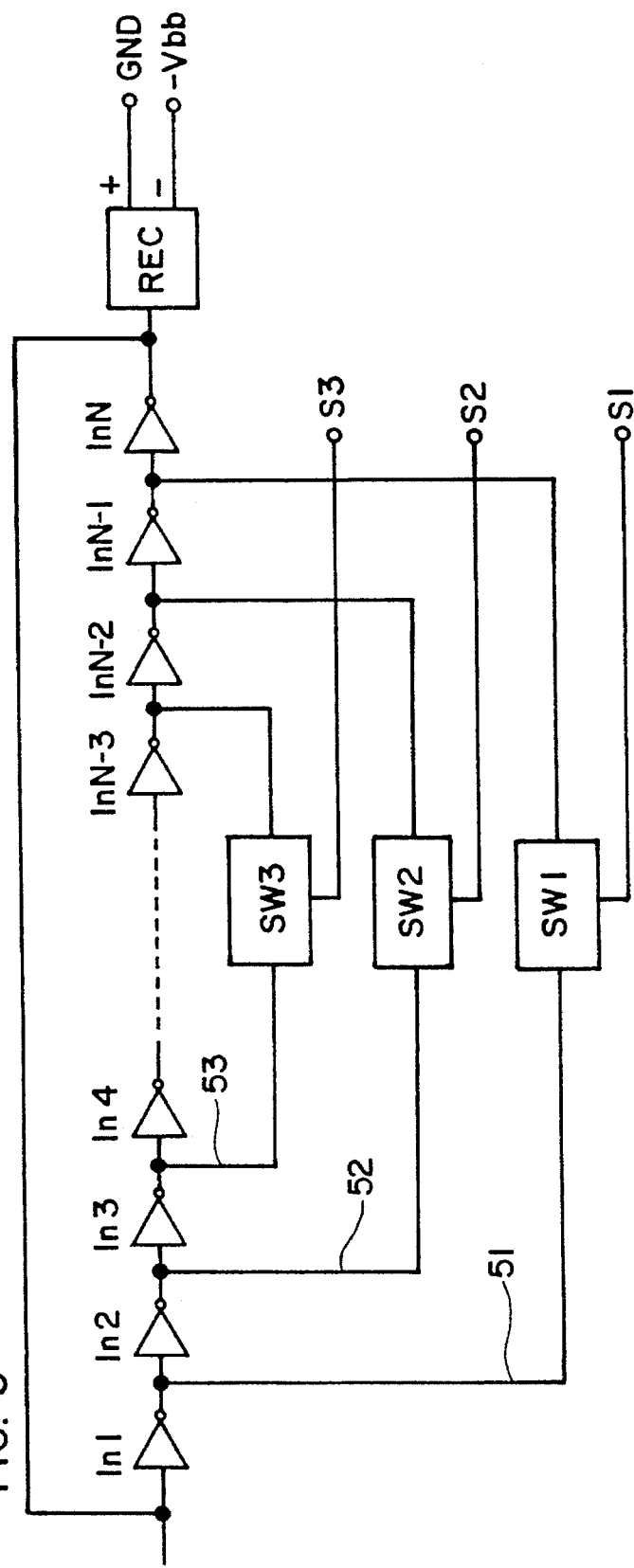
FIG. 5 is a block diagram showing the oscillator according to the present invention.

As shown in the block diagram of FIG. 5, invertors are serially arranged in the number of N (odd number), i.e., In1, In2, In3, In4, . . . Ini, . . . InN-3, InN-2, InN-1, InN. Further, rectifiers REC which are same as the conventional ones are connected to the output of the invertors, thereby generating dc power. Further, there are installed a plurality of bypass circuits 51, 52 and 53 for bypassing an arbitrary even number of the invertors. Bypassing is made by circulating oscillating signals Sg, so that the oscillating period can be controlled. Here, the plurality of the invertors perform the function of the inversion as shown in FIG. 3 and the function of delay. First, second and third control switches Sw1, Sw2 and Sw3 are inserted into the bypass circuits to connect or disconnect the bypass circuit. If the switch Sw1 is turned on to bypass the circulating oscillation signals through the first bypass circuit 51, the oscillation period becomes shortest (refer to t" of FIG. 4). If the switch Sw2 is turned on to bypass the circulating oscillation signals through the second bypass circuit 52, the oscillation period becomes less short. If the switch Sw3 is turned on to bypass the circulating oscillation signals through the third bypass circuit 53, then the oscillation period becomes least short (refer to t' in FIG. 4).

Signals S1, S2 and S3 which activate the first, second and third control switches Sw1, Sw2 and Sw3 select one or more ones from among the backbias voltage level detecting signals, the address strobe signals, the sense amplifier enable signals, the internal high voltage level detecting signals, the word line enable signals, and the internal power voltage level detecting signals, depending on the need.

Figure 1:
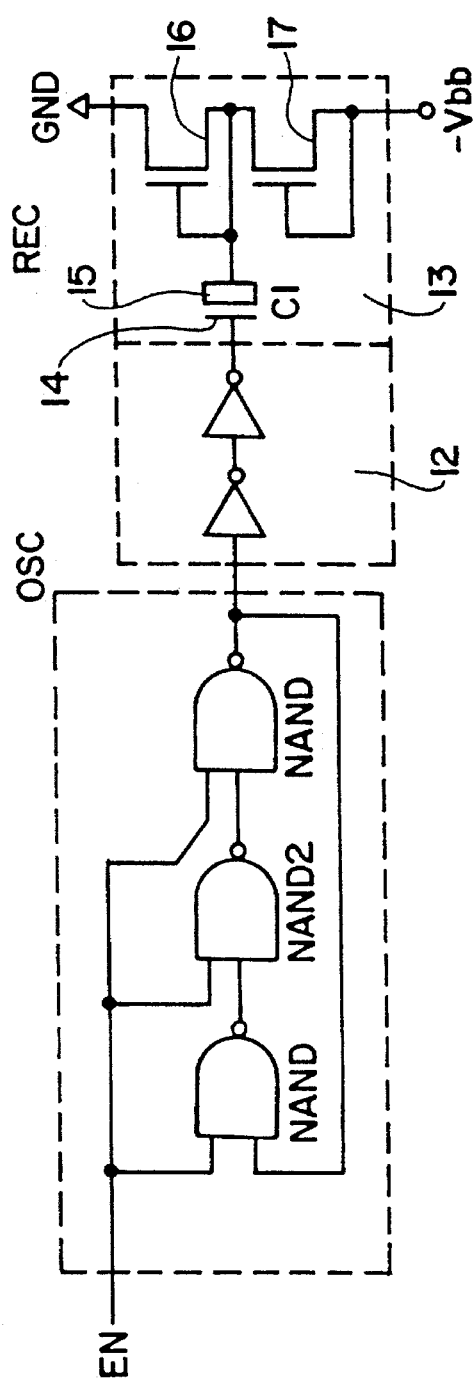
FIG. 1 illustrates the circuit of the conventional voltage generator for use in a conventional semiconductor memory device.
Figure 2:
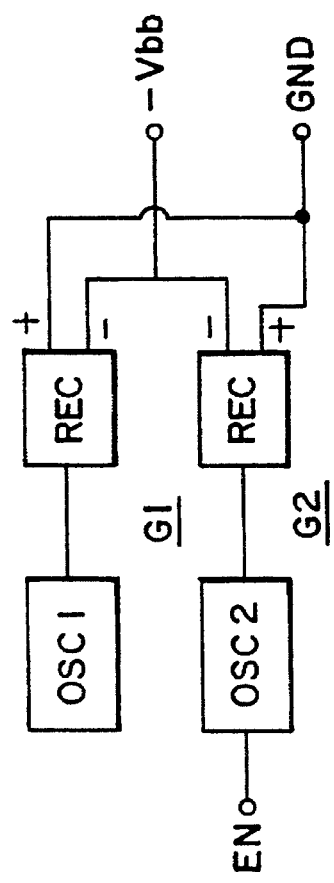
FIG. 2 is a block diagram showing the constitution of the internal backbias voltage generator for use in a conventional semiconductor memory device.
Figure 6:
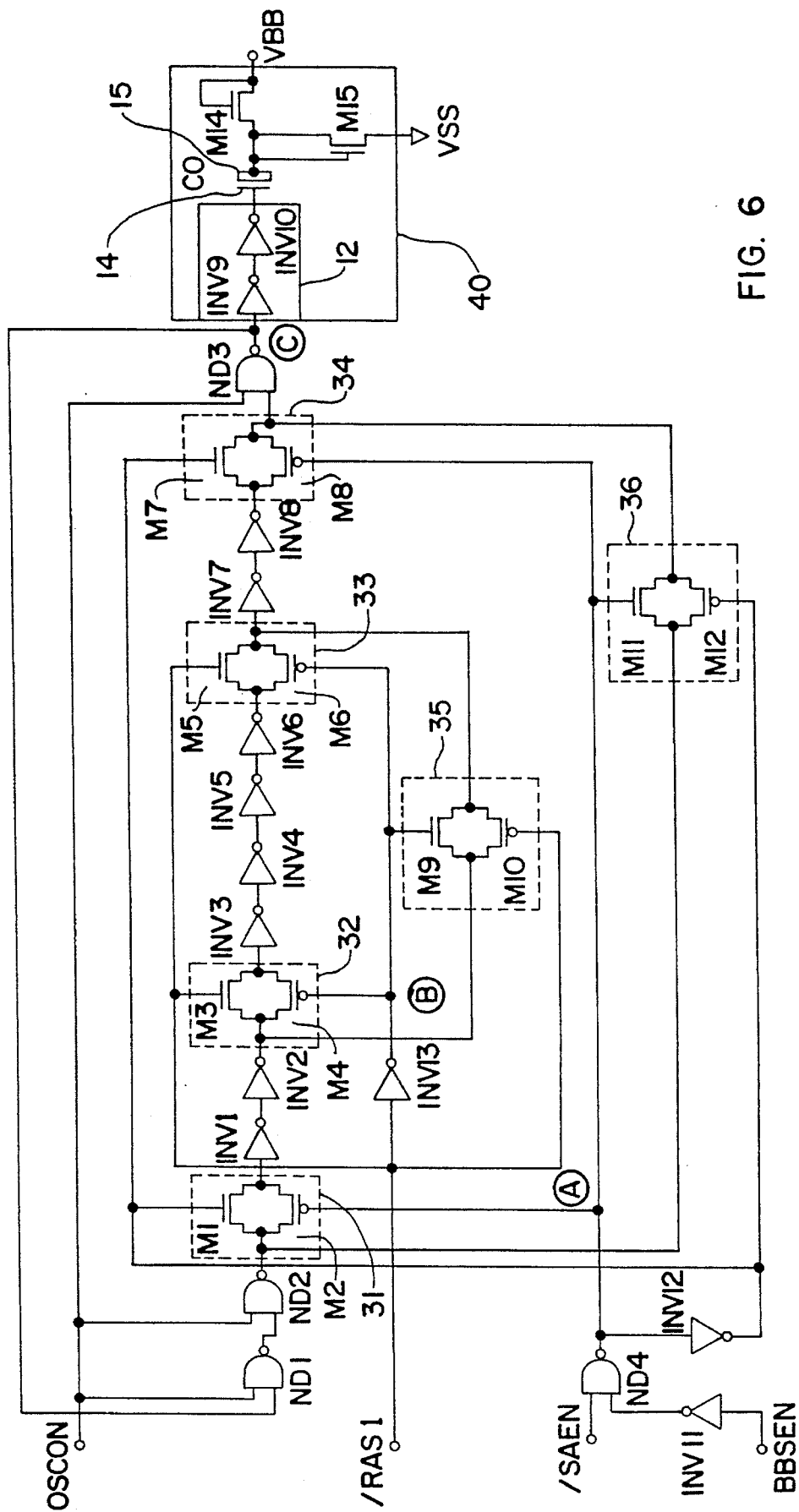
FIG. 6 illustrates in detail the circuit of the backbias voltage generator as a preferred embodiment of the present invention.

The detailed circuit of the backbias voltage generator is as shown in FIG. 6. That is, a rectifier 40 which produces a dc voltage power by rectifying clock signals is same as the conventional one of FIG. 1. The oscillator includes an odd number of inverting devices, i.e., NAND gates ND1, ND2, ND3 and invertors INV1–INV8 connected in series. The output of the last inverting device ND3 is fed back to the input of the first inverting device ND1, thereby generating clock pulses. A first bypass circuit is connected between the output side of the NAND gate ND2 and the last NAND gate ND3, so that the output of the NAND gate ND2 is supplied through a transmission gate 36, i.e., the control switch, to the input terminal of the last NAND gate ND3. A second bypass circuit is connected between the output terminal of the invertor INV2 and the input terminal of the invertor INV7, so that the output of the invertor INV2 is supplied through a transmission gate 35, i.e., the control switch, to the input of the invertor INV7.

In order to ensure that the first bypass circuit bypasses the output of the NAND gate ND2, a transmission gate 31, which is an inverse control switch, is connected between the NAND gate ND2 and the invertor INV1, and a transmission-gate 34 is connected between the invertor INV8 and the NAND gate ND3. Further, in order to ensure that the second bypass circuit bypasses the output of the invertor INV2, a transmission gate 32, which is an inverse control switch, is connected between the invertor INV2 and the invertor INV3, and a transmission gate 33 is connected between the invertor INV6 and the invertor INV7.

A third bypass circuit is used commonly with the first bypass circuit, so that the number of the bypass circuit can be reduced. A signal S1 which activates a first control switch is supplied through the invertor INV12 to the transmission gate 36. A signal which activates the inverse control switches 31 and 34 (which operate inversely to the first control switch) does not pass through the invertor INV12 but is directly connected to the transmission gates 31 and 34.

A signal S2 which activates the second control switch does not pass through the invertor INV13 but is directly supplied to the transmission gate 35. A signal which activates the inverse control switches 32 and 33 (which operate inversely to the second control switch) is supplied through the invertor INV13 to the transmission gates 32 and 33.

Signals (to be called "OSCON" below) maintained at a high level are used when other signals are stabilized such as the backbias voltage level detecting signals (to be called "BBSEN" below) for performing controls, the bit line sense amplifier enable signals (to be called "/SAEN" below) used during chip activity, the signals (to be called "/RAS1" below) which are slightly delayed relative to the row address signals (/RAS), and the power voltage Vcc.

Here, S2 represents/RAS1, and S1 represents the signals which are obtained by inverting the BBSEN signal through the invertor INV11, and the signals which are obtained by having the/SAEN signal undergo a NAND logic at the NAND gate ND4.

The control switch uses a transmission gate in which an NMOSFET and a PMOSFET are connected in parallel. The inverse control switch consists of a combination of an invertor and a transmission gate in which an NMOSFET and a PMOSFET are connected in parallel. The first input terminals of the three 2-input NAND gates are connected to the circulating signals of the oscillating circuit in series. Their second inputs simultaneously receive the power source stabilization signal OSCON which is generated when the internal power voltage of the semiconductor memory device reaches a certain predetermined level.

Like the conventional ones, the rectifier includes: a pumping capacitor CO; buffer circuits 12 (INV9 and INV10) connected to a first electrode 14 of the pumping capacitor for driving the pumping capacitor; a first rectifying device M15 connected to a second electrode 15 of the pumping capacitor for connecting the second electrode 15 to the Vss terminal when the potential of the second electrode 15 is higher than that of the Vss terminal; and a second rectifying device M14 connected to the second electrode 15 of the pumping capacitor for connecting the second electrode 15 to the Vbb terminal when the potential of the second electrode 15 is lower than that of the Vbb terminal (negative terminal).

Now the semiconductor memory device constituted as above will be described as to its operations.

Figure 7:
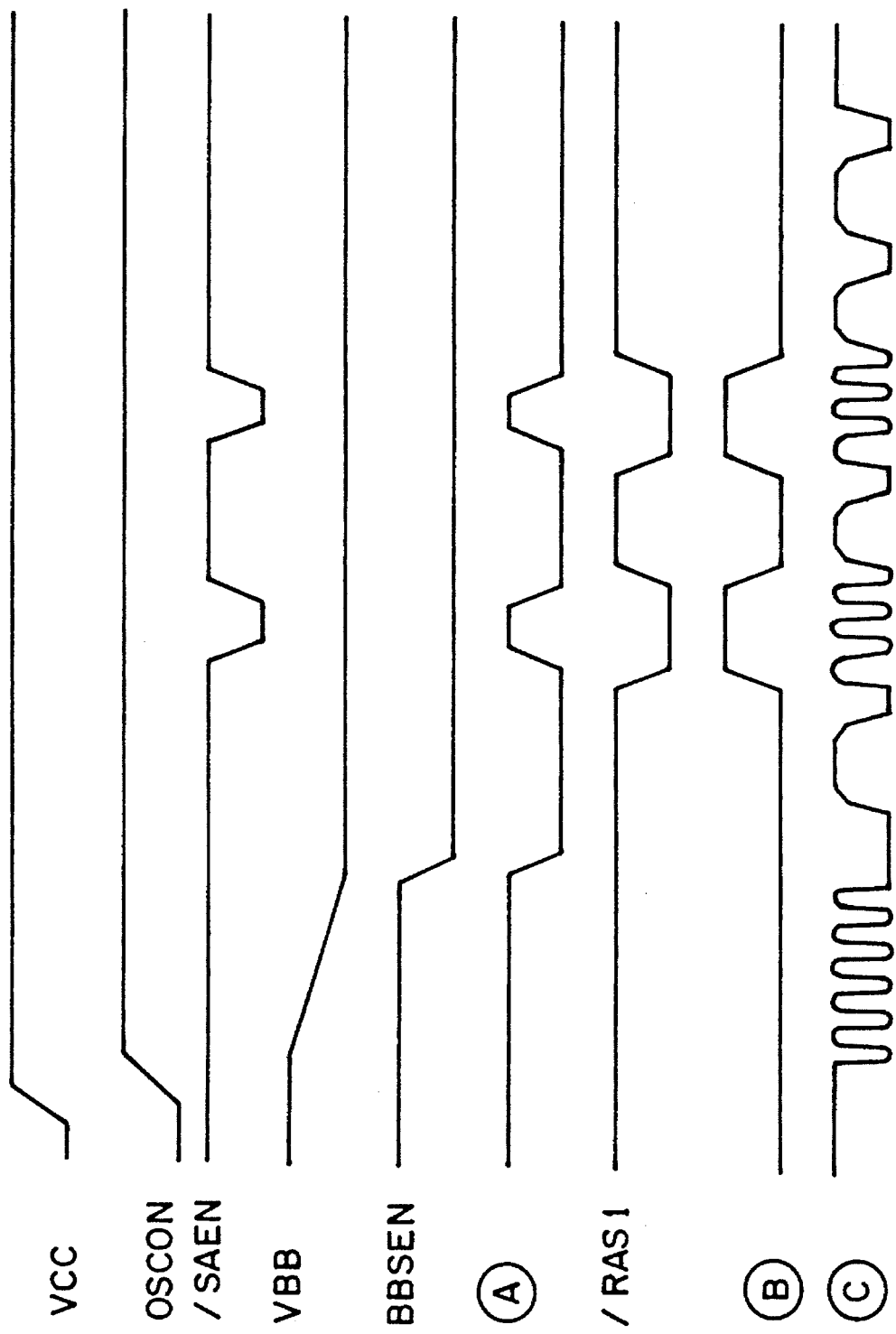
FIG. 7 is an operation timing chart of the backbias voltage generator of FIG. 6.

As shown in FIG. 7, when the power Vcc is supplied, and is stabilized, the OSCON signal becomes high, with the result that the NAND gates ND1, ND2 and ND3 are enabled to perform oscillating operations, and that the wave form of the node C becomes like wave form "C" in FIG. 7. Under this condition, the pumping capacitor CO performs pumping operations, and, therefore, the "Vbb" voltage drops. When the "Vbb" voltage reaches a certain level, the "BBSEN" signal is shifted from a high level to a low level. Thereafter, the oscillating period is varied in accordance with the "/RAS1" and "/SAEN" signals.

Until the Vbb voltage reaches a certain predetermined level, the node (A) maintains a high level to turn on only the transmission gate 36, so that the output of the NAND gate ND2 is supplied through the first bypass circuit to the input terminal of the NAND gate ND3, whereby the oscillating operation is carried out based only on the period of the NAND gates ND1–ND3.

Therefore, these oscillating signals pass through the buffer circuit 12 to charge or discharge the pumping capacitor CO. The output of the pumping capacitor CO is output in a stabilized form through the rectifying circuit 40.

Meanwhile, when the voltage Vbb reaches the predetermined level, the BBSEN signal is shifted to a low level, and from then, the node (A) depends on the /SAEN signals. Under this condition, at a standby position, i.e., in the high interval of FIG. 7, the /RAS1 signal has a high level, and the /SAEN signal also has a high level. Consequently, the node (A) is shifted to a low level to turn off the transmission gate 36. Therefore, the output of the NAND gate ND2 cannot pass through the first bypass circuit, and the invertors INV1–INV8 act as delay elements. Accordingly, the leakage currents are consumed, with the result that the oscillating period is extended to such a degree that the leakage currents at the standby condition are compensated by pumping.

Under an active condition, that is, over the interval where the /RAS signal has a low level, the /RAS1 signal is also shifted to a low level, and it is inverted to a high level by the invertor INV13. Consequently, the transmission gates 32 and 33 are turned off, and the transmission gate 35 is turned on. Meanwhile, the node (A) is maintained at the low level, and, therefore, the transmission gates 31 and 34 are turned on, while the transmission gate 36 is turned off. Consequently, only the invertors INV3–INV6 are isolated from the circulating path, with the result that the output of the NAND gate ND2 is supplied through transmission gate 31, the invertors INV1 and INV2, the transmission gate 35, the invertors INV7 and INV8 and the transmission gate 34, to the NAND gate ND3. Therefore, the oscillating period becomes shorter, and the pumping charge per unit of time is increased.

In this interval, the /SAEN signal is shifted to a low level, and, therefore, the node (A) is shifted to a high level during the operation of the sense amplifier. Therefore, the invertors INV1, INV2, INV7 and INV8 are excluded from the delaying elements, with the result that the oscillating period is further shortened, and that the pumping charge per unit of time is further increased. Consequently, many transistors such as the sense amplifiers are turned on, and a more positive measure is taken against the increasing leakage current.

Meanwhile, the case where a Vpp voltage instead of the Backbias voltage Vbb is used as the control switch controlling signal for the bypass circuit for controlling the oscillating period will be described. That is, the case where an internal high voltage (Vpp) generator is used will be described. The output of the positive terminal of the rectifier is connected to the internal high voltage terminal Vpp, while the negative terminal is connected to the ground potential Vss. Further, the transmission gates 31–36 are controlled by using word line enable signals and data output enable signals instead of the /SAEN and BBSEN signals.

Meanwhile, in the case where the internal power voltage generator is used, the transmission gates are controlled by using the word line enable signals, the sense amplifier enable signals, and the data output enable signals, which are for enabling the large power consuming transistors, thereby varying the oscillating period.

That is, instead of using the /SAEN, BBSEN, /RAS, and OSCON, the transmission gates are controlled by using the word line enable signals, the data output enable signals, the power source stabilizing signals (which are generated when the internal power voltage of the semiconductor memory device reaches the predetermined level), the internal power voltage level detecting signals, and the internal high voltage level detecting signals, whereby the device of the present invention can be used as an internal high voltage generator or an internal power generator.

According to the present invention as described above, the pumping charge rate is adjusted not by varying the size of the pumping capacitor, but by varying the oscillating period. Therefore, a large capacitor is not required, and consequently, large capacity buffer circuits and rectifying circuits for driving the large capacitor are not required. Accordingly, the peak current can be reduced, and the oscillating period can be adjusted in accordance with the purpose. As a result, the pumping charge rate per unit of time can be increased or decreased, thereby contributing to improving the reliability of the semiconductor memory device.

What is claimed is:

1. A voltage generator for generating a voltage within a semiconductor device, comprising:
    a rectifier for rectifying clock signals to produce the generated voltage;
    an oscillator coupled to the rectifier for generating clock signals, the oscillator comprising an odd number of inverting devices connected in series, wherein the output of the last inverting device is fed back to an input terminal of the first inverting device; and
    at least one bypass circuit coupled to the oscillator and connected or disconnected by at least one control switch, wherein the bypass circuit bypasses certain of the inverting devices of the oscillator, wherein the period of the clock signals generated by the oscillator varies dependent upon whether the certain inverting devices are bypassed by the bypass circuit.

2. The voltage generator as claimed in claim 1, wherein the rectifier has a positive side and a negative side, wherein the positive side of the rectifier is connected to ground potential, and the negative side of the rectifier is connected to a backbias terminal of the semiconductor device.

3. The voltage generator as claimed in claim 1, wherein the at least one control switch is turned on or off dependent upon a backbias voltage level detecting signal.

4. The voltage generator as claimed in claim 1 wherein the at least one control switch is turned on or off dependent upon an address strobe signal.

5. The voltage generator as claimed in claim 1, wherein the at least one control switch is turned on or off dependent upon a sense amplifier enable signal.

6. The voltage generator as claimed in claim 1, wherein the at least one bypass circuit comprises:
    a first bypass circuit having a first control switch, the first control switch turning on or off dependent upon a backbias voltage level detecting signal;
    a second bypass circuit having a second control switch, the second control switch turning on or off dependent upon an address strobe signal; and
    a third bypass circuit having a third control switch, the third control switch turning on or off dependent upon a sense amplifier enable signal.

7. The voltage generator as claimed in claim 6, wherein the first, second and third bypass circuits are turned on or off, respectively, dependent upon the backbias voltage level detecting signal, the address strobe signal and the sense amplifier enable signal.

8. The voltage generator as claimed in claim 1, wherein the inverting devices comprise three 2-input NAND gates and an even number of inverters.

9. The voltage generator as claimed in claim 1, wherein the control switch comprises a transmission gate, wherein the transmission gate comprises an NMOSFET and a PMOSFET connected in parallel.

10. The voltage generator as claimed in claim 6, wherein the first and third bypass circuits bypass the same inverting devices, and wherein the first and third control switches comprise a common control switch; and
    the first and third bypass circuits are coupled to a logic circuit, the logic circuit turning the common control switch on or off dependent upon the backbias voltage level detecting signal or the sense amplifier enable signal.

11. The voltage generator as claimed in claim 10, wherein the logic circuit comprises a 2-input NAND gate, wherein the 2-input NAND gate receives the backbias voltage level detecting signal and the sense amplifier enable signal, and the output of the 2-input NAND gate is connected to a control input terminal of the common control switch.

12. The voltage generator as claimed in claim 6, wherein the second bypass circuit bypasses a smaller number of inverting devices as compared with the first and third bypass circuits.

13. The voltage generator as claimed in claim 1, wherein inverse control switches are serially connected to the front and rear of the inverting devices to be bypassed, wherein the inverse control switches are turned on or off dependent upon whether the at least one control switch is turned off or on.

14. The voltage generator as claimed in claim 13, wherein the inverse control switches are serially connected to the front and rear of the inverting devices to be bypassed, wherein the inverse control switches when turned off decouple the bypassed inverting devices from the oscillator.

15. The voltage generator as claimed in claim 13, wherein the inverse control switches comprise transmission gates.

16. The voltage generator as claimed in claim 8, wherein the first input terminals of the three 2-input NAND gates are serially connected to circulating signals of the oscillator, and the second input terminals of the three 2-input NAND gates simultaneously receive a power stabilizing signal, wherein the power stabilizing signal is generated when an internal power voltage of the semiconductor device reaches a predetermined level.

17. The voltage generator as claimed in claim 1, wherein the rectifier comprises:

a pumping capacitor having first and second electrodes;

a buffer circuit connected to the first electrode of the pumping capacitor for driving the pumping capacitor;

a first rectifying device connected to the second electrode of the pumping capacitor for connecting the second electrode to a positive terminal of the semiconductor device when the potential of the second electrode is higher than that of the positive terminal;

a second rectifying device connected to the second electrode of the pumping capacitor for connecting the second electrode to a negative terminal of the semiconductor device when the potential of the second electrode is lower than that of the negative terminal.

18. The voltage generator as claimed in claim 17, wherein the positive terminal is connected to an internal high voltage terminal of the semiconductor device, and the negative terminal is connected to ground potential.

19. The voltage generator as claimed in claim 18, wherein the control switch is turned on or off dependent upon an internal high voltage level detecting signal.

20. The voltage generator as claimed in claim 18, wherein the control switch is turned on or off dependent upon a word line enable signal.

21. The voltage generator as claimed in claim 18, wherein the at least one bypass circuit comprises:

a first bypass circuit having a control switch turned on or off dependent upon an internal high voltage level detecting signal; and a second bypass circuit having a control switch turned on or off dependent upon a word line enable signal.

22. The voltage generator as claimed in claim 21, wherein the first and second bypass circuits are turned on or off, respectively, dependent upon the internal high voltage level detecting signal or the word line enable signal.

23. The voltage generator as claimed in claim 18, wherein the inverting devices comprise three 2-input NAND gates and an even number of inverters.

24. The voltage generator as claimed in claim 18, wherein the control switch comprises a transmission gate, the transmission gate comprising an NMOSFET and a PMOSFET connected in parallel.

25. The voltage generator as claimed in claim 21, wherein the first bypass circuit and the second bypass circuit bypass the same inverting devices, wherein the control switches of the first and second bypass circuits comprise a common control switch, wherein the first bypass circuit and the second bypass circuit are coupled to a logic circuit, wherein the common control switch is turned on or off dependent upon the internal high voltage level detecting signal or the word line enable signal.

26. The voltage generator as claimed in claim 25, wherein the logic circuit comprises a 2-input NAND gate, wherein the input terminals of the NAND gate respectively receive the internal high voltage level detecting signal and the word line enable signal, wherein the output terminal of the 2-input NAND gate is connected to a control input terminal of the common control switch.

27. The voltage generator as claimed in claim 18, wherein inverse control switches are serially connected to the front and rear of the inverting devices to be bypassed, the inverse control switches being turned on or off dependent upon the turning off or on of the common control switch.

28. The voltage generator as claimed in claim 21, wherein the inverse control switches are serially connected to the front and rear of the inverting devices to be bypassed, wherein the inverse control switches when turned off decouple the bypassed inverting devices from the oscillator.

29. The voltage generator as claimed in claim 28, wherein the inverse control switches comprise transmission gates.

30. The voltage generator as claimed in claim 23, wherein the first input terminals of the three 2-input NAND gates are serially connected to circulating signals of the oscillator, and the second input terminals of the three 2-input NAND gates simultaneously receive a power source stabilizing signal, wherein the power source stabilizing signal is generated when an internal power voltage of the semiconductor device reaches a predetermined level.

31. The voltage generator as claimed in claim 1, wherein the rectifier has a positive output terminal that is connected to an internal power voltage terminal, and a negative terminal that is connected to ground potential, wherein the voltage generator generates an internal power voltage.

32. The voltage generator as claimed in claim 31, wherein the control switch is turned on or off dependent upon an internal power voltage level detecting signal.

33. The voltage generator as claimed in claim 31, wherein the control switch is turned on or off dependent upon a sense amplifier enable signal.

34. The voltage generator as claimed in claim 31, wherein the at least one bypass circuit comprises:

a first bypass circuit having a control switch turned on or off dependent upon an internal power level detecting signal;

a second bypass circuit having a control switch turned on or off dependent upon a data output enable signal; and a third bypass circuit having a control switch turned on or off dependent upon a sense amplifier enable signal.

35. The voltage generator as claimed in claim 34, wherein the first, second and third bypass circuits are turned on or off dependent upon the internal power voltage level detecting signal, the data output enable signal, or the sense amplifier enable signal, wherein the period of the clock signals generated by the oscillator varies dependent upon the internal power voltage level detecting signal, the data output enable signal, or the sense amplifier enable signal.

36. The voltage generator as claimed in claim 31, wherein the inverting devices comprise three 2-input NAND gate and an even number of inverters.

37. The voltage generator as claimed in claim 31, wherein the control switches comprise transmission gates, wherein the transmission gates comprise an NMOSFET and a PMOSFET connected in parallel.

38. The voltage generator as claimed in claim 35, wherein the first and third bypass circuits bypass the same inverting devices, wherein the control switches of the first and third bypass circuits comprise a common control switch, wherein the first bypass circuit and the third bypass circuit are coupled to a logic circuit, wherein the common control switch is turned on or off dependent upon the internal power voltage level detecting signal or the sense amplifier enable signal.

39. The voltage generator as claimed in claim 38, wherein the logic circuit comprises a 2-input NAND gate, wherein the input terminals of the NAND gate respectively receive the internal power voltage level detecting signal and the sense amplifier enable signal, and the output terminal of the NAND gate is connected to a control input terminal of the common control switch.

40. The voltage generator as claimed in claim 34, wherein the second bypass circuit bypasses a smaller number of inverting devices than the first and third bypass circuits.

41. The voltage generator as claimed in claim 31, wherein inverse control switches are serially connected to the front and rear of the inverting devices to be bypassed, wherein the inverse control switches are turned on or off upon dependent upon whether the control switch is turned off or on.

42. The voltage generator as claimed in claim 34, wherein inverse control switches are serially connected to the front and rear of the inverting devices to be bypassed, wherein the inverse control switches when turned off decouple the bypassed inverting devices from the oscillator.

43. The voltage generator as claimed in claim 42, wherein the inverse control switches comprise transmission gates.

44. The voltage generator as claimed in claim 36, wherein the first input terminals of the three 2-input NAND gates are serially connected to circulating signals of the oscillator, and the second inputs of the three 2-input NAND gates simultaneously receive an external power stabilizing signal, wherein the external power stabilizing signal is generated when the external power voltage of the semiconductor device reaches a predetermined level.

* * * * *